(12) United States Patent
Sankman et al.

(10) Patent No.: US 11,581,287 B2
(45) Date of Patent: Feb. 14, 2023

(54) CHIP SCALE THIN 3D DIE STACKED PACKAGE

(71) Applicant: Intel Corporation, Santa Clara, CA (US)

(72) Inventors: Robert Sankman, Phoenix, AZ (US); Sanka Ganesan, Chandler, AZ (US); Bernd Waidhas, Pettendorf (DE); Thomas Wagner, Regelsbach (DE); Lizabeth Keser, Munich (DE)

(73) Assignee: Intel Corporation, Santa Clara, CA (US)

( * ) Notice: Subject to any disclaimer, the term of this patent is extended or adjusted under 35 U.S.C. 154(b) by 1083 days.

(21) Appl. No.: 16/024,700

(22) Filed: Jun. 29, 2018

(65) Prior Publication Data

US 2020/0006293 A1 Jan. 2, 2020

(51) Int. Cl.
*H01L 25/065* (2006.01)

(52) U.S. Cl.
CPC .......... *H01L 25/0657* (2013.01); *H01L 2225/06513* (2013.01); *H01L 2225/06517* (2013.01);
(Continued)

(58) Field of Classification Search
CPC ....... H01L 25/0657; H01L 2225/06513; H01L 2225/06582; H01L 2225/06541; H01L 2225/06562; H01L 2225/06517; H01L 2224/16146; H01L 2224/13147; H01L 23/49816; H01L 24/20; H01L 23/13; H01L 2924/15151; H01L 2924/16152; H01L 2924/15153; H01L 2224/14134; H01L 2224/14135; H01L 2224/13005; H01L 2224/13082; H01L 2224/171; H01L 24/13; H01L 24/17; H01L 24/16; H01L 2224/16227; H01L 2224/16145; H01L 2225/06527; H01L 2225/06568; H01L 2225/06586
See application file for complete search history.

(56) References Cited

U.S. PATENT DOCUMENTS 5,963,794 A * 10/1999 Fogal ................ H01L 24/49
438/106
6,084,308 A 7/2000 Kelkar
(Continued)

OTHER PUBLICATIONS

International Preliminary Report on Patentability for International Patent Application No. PCT/US2019/031174, dated Jan. 7, 2021, 9 pgs.
(Continued)

*Primary Examiner* — Mamadou L Diallo
(74) *Attorney, Agent, or Firm* — Schwabe, Williamson & Wyatt, P.C.

(57) ABSTRACT

Embodiments disclosed herein include an electronics package comprising stacked dies. In an embodiment, the electronics package comprises a first die that includes a plurality of first conductive interconnects extending out from a first surface of the first die. In an embodiment, the first die further comprises a keep out zone. In an embodiment, the electronic package may also comprise a second die. In an embodiment, the second die is positioned entirely within a perimeter of the keep out zone of the first die. In an embodiment, a first surface of the second die faces the first surface of the first die.

23 Claims, 16 Drawing Sheets

(52) U.S. Cl.
CPC ............ *H01L 2225/06541* (2013.01); *H01L 2225/06562* (2013.01); *H01L 2225/06582* (2013.01)

(56) References Cited

U.S. PATENT DOCUMENTS

| | | | |
|---|---|---|---|
| 6,930,378 B1 | 8/2005 | St. Amand et al. | |
| 9,607,863 B1* | 3/2017 | Lee ..................... | H01L 25/50 |
| 9,721,924 B2* | 8/2017 | Lee ..................... | H01L 23/3157 |
| 9,847,320 B2* | 12/2017 | Chen ................... | H01L 25/0657 |
| 9,865,548 B2* | 1/2018 | Uzoh .................. | H01L 21/76898 |
| 10,026,671 B2* | 7/2018 | Yu ...................... | H01L 23/36 |
| 10,490,528 B2* | 11/2019 | Prabhu ................ | H01L 24/47 |
| 2004/0046263 A1* | 3/2004 | Harper ................ | H01L 25/18 257/777 |
| 2005/0133933 A1* | 6/2005 | Shen ................... | H01L 24/13 257/E23.021 |
| 2008/0142990 A1* | 6/2008 | Yu ...................... | H01L 25/0657 438/109 |
| 2009/0200663 A1* | 8/2009 | Daubenspeck ... | H01L 23/49816 257/E21.511 |
| 2011/0316117 A1* | 12/2011 | Kripesh .............. | H01L 21/02164 257/532 |
| 2012/0104623 A1* | 5/2012 | Pagaila ............... | H01L 23/13 257/E21.503 |
| 2014/0191419 A1* | 7/2014 | Mallik ................ | H01L 23/49838 257/777 |
| 2014/0219016 A1* | 8/2014 | Li ....................... | G06F 30/30 365/182 |
| 2014/0264791 A1* | 9/2014 | Manusharow ...... | H01L 23/5383 438/107 |
| 2015/0145116 A1* | 5/2015 | Uzoh .................. | H01L 24/94 257/777 |
| 2015/0235990 A1* | 8/2015 | Cheng ................. | H01L 24/20 257/773 |
| 2015/0255411 A1* | 9/2015 | Karhade ............. | G06F 1/1694 361/679.55 |
| 2015/0279804 A1* | 10/2015 | Raravikar ........... | H01L 25/50 257/737 |
| 2015/0279805 A1* | 10/2015 | Karhade ............. | H01L 21/76883 257/737 |
| 2015/0364344 A1* | 12/2015 | Yu ...................... | H01L 23/367 257/713 |
| 2016/0133557 A1* | 5/2016 | Mortensen .......... | H01L 24/11 257/738 |
| 2017/0084576 A1* | 3/2017 | Yu ...................... | H01L 21/31053 |
| 2017/0213810 A1* | 7/2017 | Ding ................... | H01L 25/50 |
| 2019/0057940 A1* | 2/2019 | Cheah ................. | H01L 25/50 |
| 2021/0028147 A1* | 1/2021 | Yu ...................... | H01L 23/49838 |

OTHER PUBLICATIONS

International Search Report and Written Opinion from International Patent Application No. PCT/US2019/031174, dated Aug. 20, 2019, 12 pgs.

Search Report from European Patent Application No. 19826954.0, dated Jan. 28, 2022, 13 pgs.

Search Report from European Patent Application No. 19826954.0, dated May 3, 2022, 12 pgs.

* cited by examiner

CHIP SCALE THIN 3D DIE STACKED PACKAGE

TECHNICAL FIELD

Embodiments of the present disclosure relate to electronics packaging, and more particularly, packaging configurations that comprise 3D stacking with face-to-face die stacking.

BACKGROUND

In order to provide increased computing power and/or functionality, electronics packages often include a plurality of dies that are communicatively coupled to each other. For example, memory dies may be communicatively coupled to a processor die. In order to provide improved form-factors, the plurality of dies are often stacked.

One example of stacked dies includes a main die that is flip chip mounted to a package substrate and a stacked die formed over the backside surface of the main die. The stacked die may be wire bonded to the package substrate. In such a configuration, the main die and the stacked die are oriented in a back-to-back configuration (i.e., the surfaces with active devices of each die face away from each other). The wire bonds increase the Z-height of the package and increase the X-Y form factor.

An additional example of stacked dies includes a package-on-package (PoP) configuration. In such configurations the main die may be flip chip mounted to a first package substrate, and the stacked die may be wire bonded to a second package substrate. The second package substrate may be electrically coupled to the first package substrate by conductive pillars formed around the perimeter of the main die. In such a configuration, the main die and the stacked die are oriented in a back-to-back configuration. The wire bonds and the extra package substrate increase the Z-height of the package and the need for pillars surrounding the first package increases the X-Y form factor.

An additional example of stacked dies includes a main die that is flip chip mounted to the package substrate with a stacked die coupled to a backside surface of the main die. In such configurations, the main die may have through silicon vias (TSVs) to provide electrical connections from the active surface of the main die to the active surface of the stacked die. In such a configuration, the main die and the stacked die are oriented in a back-to-front configuration (i.e., the backside surface of the main die faces the active surface of the stacked die). Such configurations provide improved Z-height and X-Y form factors compared to the wire bonded stacked dies and PoP configurations. However, the inclusion of TSVs significantly increases the cost and complexity of the main die.

Yet another configuration of stacked dies includes a main die that is flip chip mounted to a first surface of the package substrate, and a stacked die that is flip chip mounted to a second surface of the package substrate. Such an embodiment improves Z-height and X-Y form factor compared to wire bonded stacked dies and PoP configurations. However, mounting the stacked die to the second surface of the package substrate necessitates that the second level interconnects be depopulated where the second die is located.

EMBODIMENTS OF THE PRESENT DISCLOSURE

Described herein are electronics packages with stacked dies and methods of forming stacked die packages. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects.

For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the drive towards increased functionality has necessitated communicatively coupling a plurality of dies together. However, this has led to an increase in the form factor of such electronics packages. Accordingly, embodiments described herein include a plurality of dies that are packaged with a face-to-face configuration. As used herein, face-to-face may refer to the active surface of a first die being oriented so that it faces the active surface of a second die.

In an embodiment, the face-to-face configuration may be implemented by placing die pads as a bump out on the edge of the first die. The interior surface area of the first die may be a keep-out zone. Additional dies may be stacked within the perimeter of the keep-out zone. Attachments to second level interconnects from the first die may be formed with pillars or conductive features in redistribution layers. Accordingly, embodiments allow for flip chip configurations, wafer level chip scale package (WLCSP) configurations, fan-out configurations, and the like.

Figure 1A:
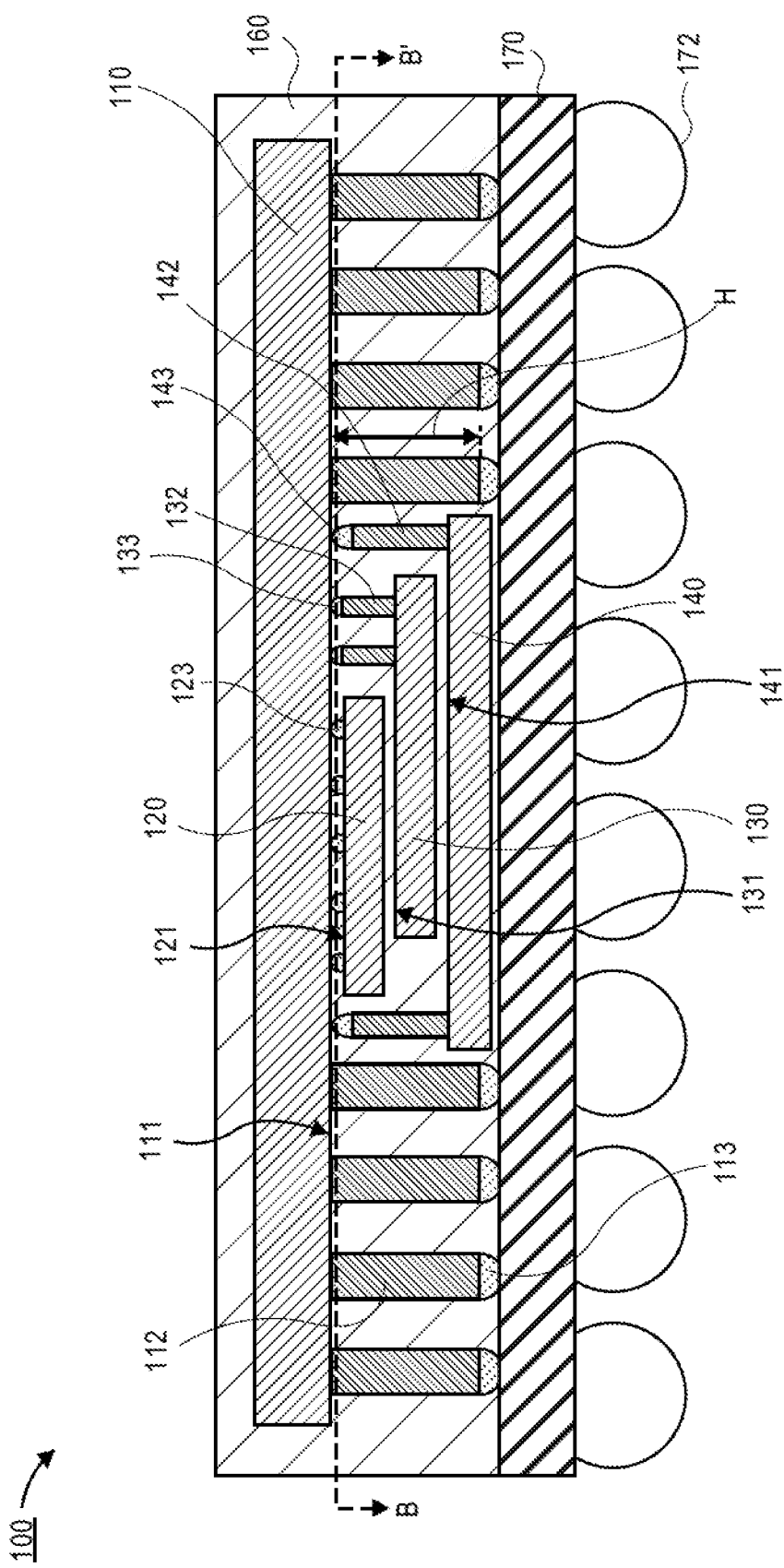
FIG. 1A is a cross-sectional illustration of an electronics package with a first die and a plurality of stacked dies in a face-to-face orientation with the first die, in accordance with an embodiment.

Referring now to FIG. 1A, a cross-sectional illustration of an electronics package 100 is shown, in accordance with an embodiment. In an embodiment, the electronics package 100 may comprise a plurality of stacked dies. In an embodiment, a first die 110 may be flip chip mounted to a package substrate 170. A first surface 111 of the first die 110 may be oriented so that the first surface 111 faces the package substrate 170. In an embodiment, the first surface 111 may be referred to as the active surface of the first die 110. For example, the active features (e.g., transistors or the like) may be formed proximate to the first surface 111 of the first die 110.

In an embodiment, the package substrate 170 may comprise second level interconnects (SLIs) 172 that are electrically coupled to the first die 110. In an embodiment, the first die 110 may be electrically coupled to the package substrate 170 by conductive pillars 112 and solder bumps 113. In an embodiment, the conductive pillars 112 may extend out from the first surface 111 of the first die 110. In an embodiment, the conductive pillars 112 may have a height H that is sufficient to allow for one or more dies to be stacked between the first surface 111 of the first die 110 and the package substrate 170. For example, in FIG. 1A, a second die 120, a third die 130, and a fourth die 140 are stacked between the first die 110 and the package substrate 170. In an embodiment, the conductive pillars 112 may have a height H that is 20 µm or greater, 50 µm or greater, or 100 µm or greater. In an embodiment, the conductive pillars 112 may be high-aspect ratio conductive pillars. For example, the conductive pillars 112 may have a height:width aspect ratio of 2:1 or greater, 3:1 or greater, or 5:1 or greater. In an embodiment, the conductive pillars 112 may be any suitable conductive material. For example, the conductive pillars 112 may be copper or the like.

In an embodiment, one or more of the dies stacked between the first die 110 and the package substrate 170 may be oriented in a face-to-face configuration with the first die 110. For example, in the embodiment illustrated in FIG. 1A the second die 120, the third die 130, and the fourth die 140 are oriented in a face-to-face configuration with the first die 110. Particularly, a first surface 121 of the second die 120, a first surface 131 of the third die 131, and a first surface 141 of the fourth die each are oriented so that they face the first surface 111 of the first die. In an embodiment, the first surfaces 121, 131, and 141 may be the active surfaces of the dies 120, 130, and 140, respectively.

In an embodiment, the stacked dies may be electrically coupled to the first die 110 by solder bumps and/or conductive pillars. In an embodiment, the second die 120 is electrically coupled to the first die 110 by solder bumps 123 and/or copper pillars (not shown). In an embodiment, the third die 130 is electrically coupled to the first die 110 by conductive pillars 132 and solder bumps 133 over the conductive pillars 132. In an embodiment, the fourth die 140 is electrically coupled to the first die 110 by conductive pillars 142 and solder bumps 143 over the conductive pillars 142. While conductive pillars are referred to herein as forming the interconnects between dies, it is to be appreciated that any suitable structure may be used to overcome the distance between the dies. For example, conductive pillars may be replaced with copper core bumps, or the like.

In an embodiment, the electronics package 100 may further include a mold layer 160 formed around the plurality of dies 110, 120, 130, 140, and over the package substrate 170. For example, the plurality of dies 110 may be fully embedded within the mold layer 160. However, additional embodiment may include a mold layer 160 that exposes portions of the first die 110 (e.g., a backside surface of the first die 110). In an embodiment, the first die 110 may be electrically coupled to second level interconnects (SLIs) 172 by the package substrate 170. In an embodiment, the SLIs 172 may be solder bumps, or any other SLI architecture.

In an embodiment, the plurality of dies may have any functionality. In a particular embodiment, the first die 110 may be a processor and one or more of the second die 120, the third die 130, and the fourth die 140 may be memory dies. However, face-to-face stacked dies used in accordance with embodiments may have other functionalities (e.g., RF transceivers, power management, graphics processing, etc.).

Figure 1B:
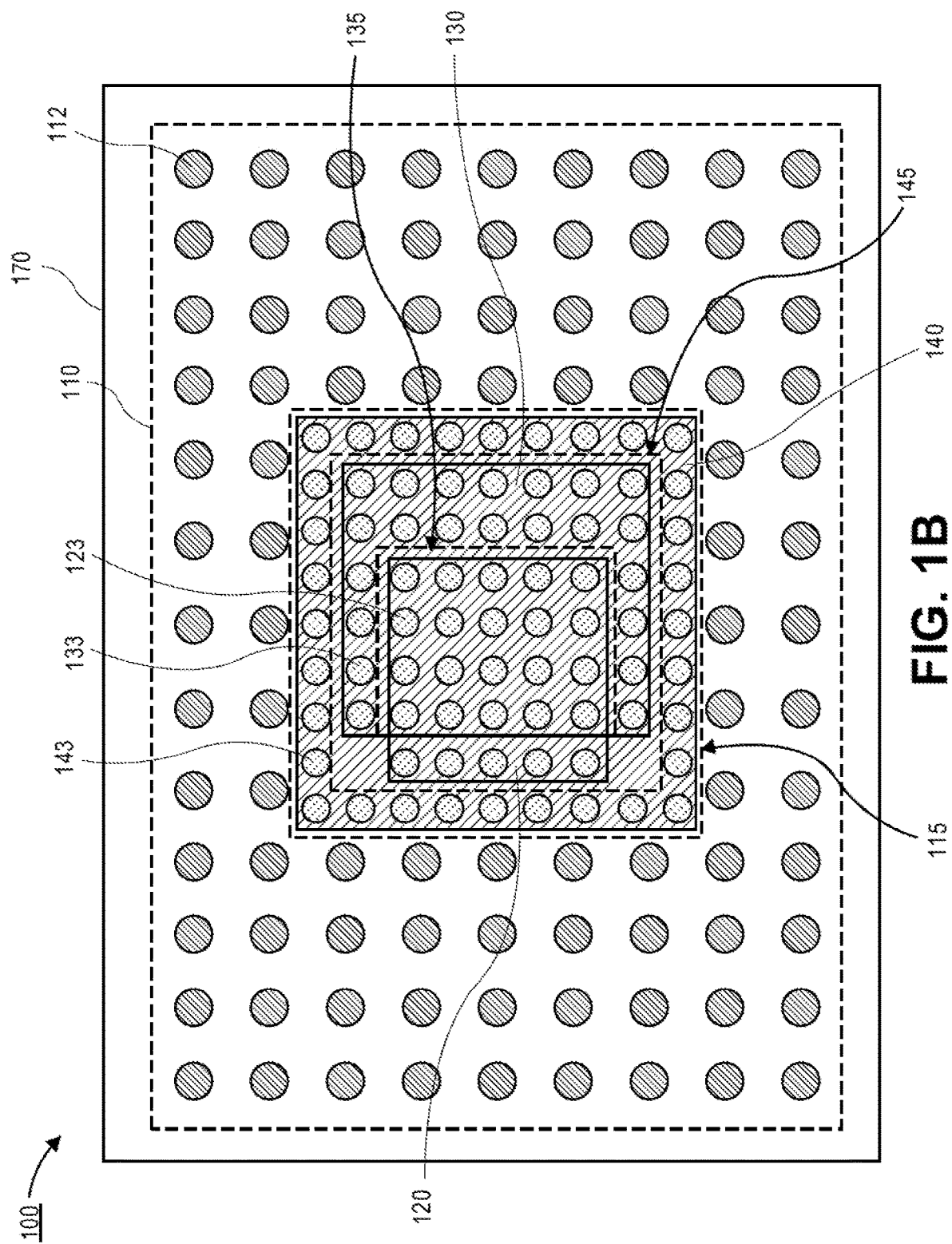
FIG. 1B is a plan view illustration of the electronics package in FIG. 1A along line B-B', in accordance with an embodiment.

Referring now to FIG. 1B, a plan view illustration of FIG. 1A along line B-B' is shown, in accordance with an embodiment. FIG. 1B illustrates that layout of the plurality of dies that enables the stacked face-to-face configuration of the plurality of dies 110, 120, 130, and 140.

In the illustrated embodiment, the perimeter of the first die 110 is represented as a dashed line. In an embodiment, the first die 110 may comprise a keep-out-zone 115. In an embodiment, the plurality of conductive pillars 112 are formed outside of the perimeter of the keep-out zone 115. For example, the first die 110 may comprise die pads outside of the keep-out zone 115 or a redistribution layer (RDL) may be used to reroute the die pads to outside the keep-out zone 115.

In an embodiment, the one or more stacked dies (i.e., dies 120, 130, and 140) may be positioned within the keep-out zone 115 of the first die 110. As used herein, when a die is referred to as being positioned within a keep-out zone of another die, it is to be appreciated that the relative positioning of the dies refers to their positioning in the X-Y plane.

In an embodiment, one or more of the stacked dies 120, 130, and 140 may have their own keep-out zones. Providing keep-out zones in one or more of the stacked dies allows for each die to have a direct connection to the first die 110. As such, through silicon vias (TSVs) are not needed, and costs may be reduced. However, as will be described in greater detail below, embodiments are not limited to configurations without TSVs.

In an embodiment, the stacked die closest to the first die 110 (i.e., the second die 120) may not have a keep-out zone. In an embodiment, the third die 130 may have a keep-out zone 135. In an embodiment, the second die 120 may be positioned within the perimeter of the keep-out zone 135 of the third die 130. In the illustrated embodiment, the second die 120 is not entirely within the keep-out zone 135 of the third die. For example, the second die 120 may not be stacked directly over the third die 130. However, embodiments may also include a second die 120 that is stacked directly over the third die 130. In such embodiments, the second die 120 may be entirely within the keep-out zone 135 of the third die.

In an embodiment, the fourth die 140 may have a keep-out zone 145. In an embodiment, the second die 120 and the third die 130 may be positioned within the perimeter of the keep-out zone 145. In the illustrated embodiment, the second die 120 and the third die 130 are entirely within the keep-out zone 145 of the fourth die 140. However, it is to be appreciated that one or both of the second die 120 and the third die 130 may be offset from the fourth die 140 (i.e., not entirely over the fourth die 140), and as such, may be partially outside the keep-out zone 145.

Figure 2:
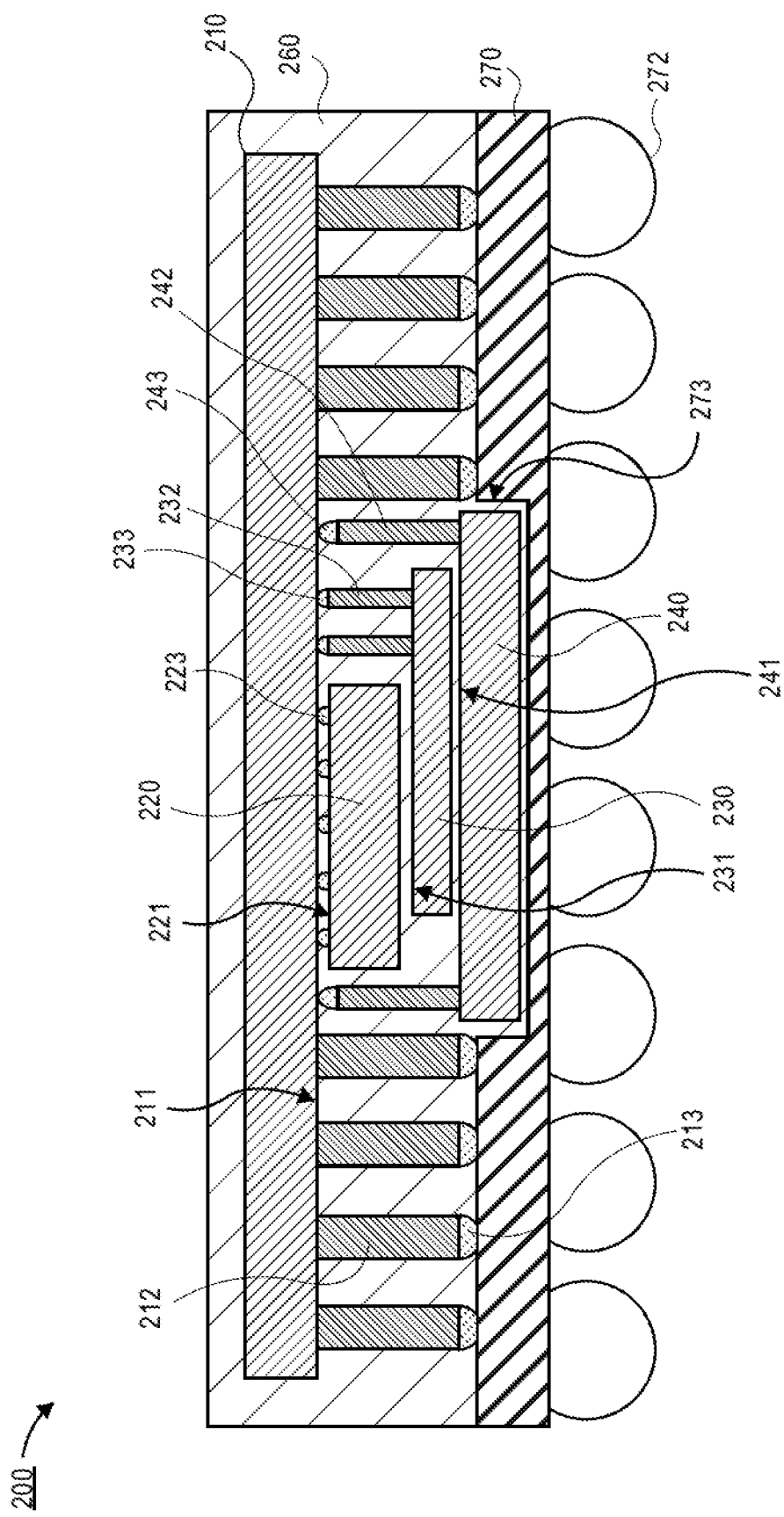
FIG. 2 is a cross-sectional illustration of an electronics package with a first die and a plurality of stacked dies where the package substrate includes a cavity, in accordance with an embodiment.

Referring now to FIG. 2, a cross-sectional illustration of an electronics package 200 is shown in accordance with an additional embodiment. In an embodiment, the electronics package 200 may be substantially similar to the electronics package 100 described above, with the exception that the package substrate 270 may include a cavity 273. In an embodiment, the cavity 273 may be formed in the shadow of the keep-out zone of the first die 210. As such, one or more of the stacked dies may extend into the cavity 273. For example, the fourth die 240 is partially set into the cavity 273. The formation of the cavity 273 allows for Z-height reduction, the ability to stack thicker dies, and/or the ability to stack more dies.

Figure 3:
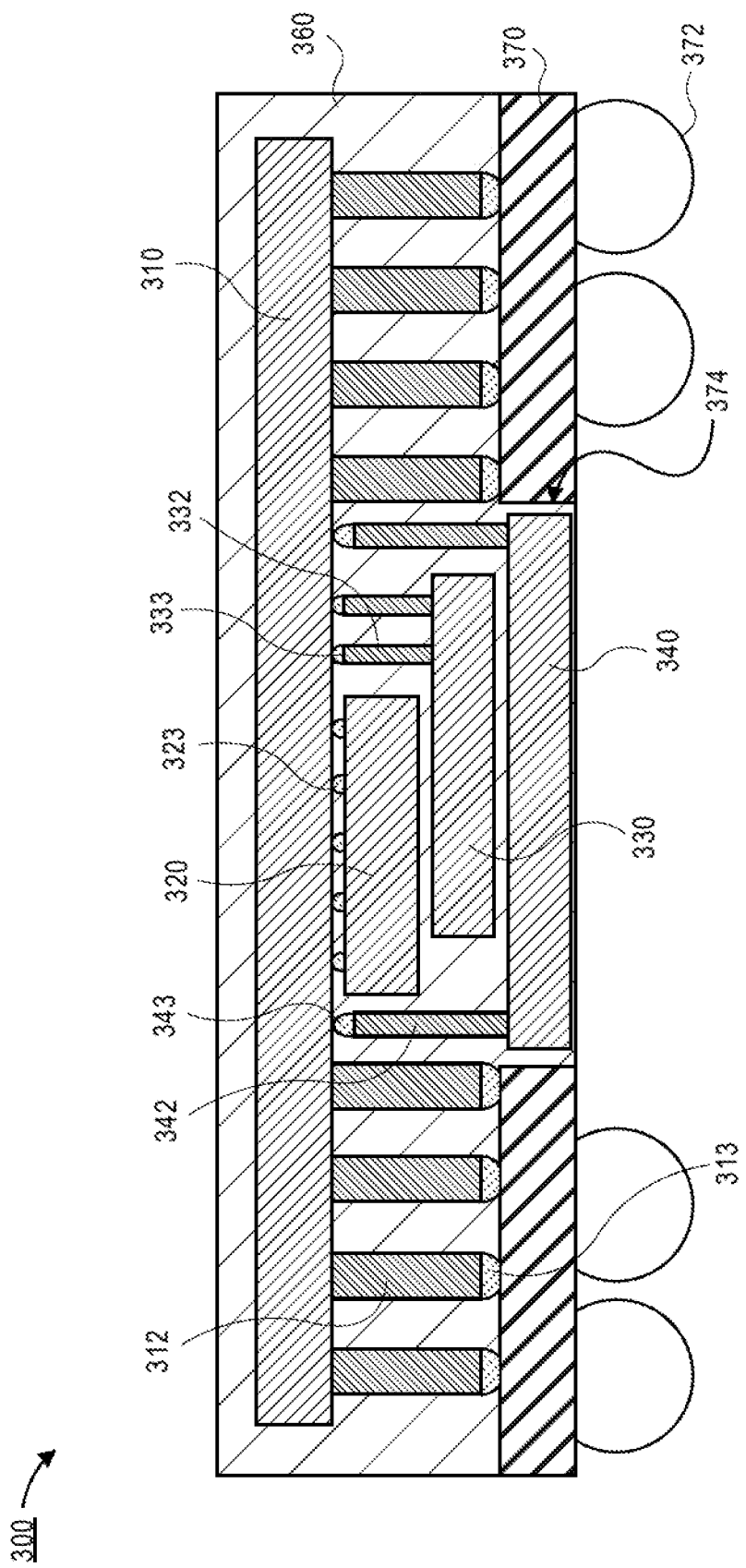
FIG. 3 is a cross-sectional illustration of an electronics package with a first die and a plurality of stacked dies where the package substrate includes a through-hole, in accordance with an embodiment.

Referring now to FIG. 3, a cross-sectional illustration of an electronics package 300 is shown, in accordance with an additional embodiment. In an embodiment, the electronics package 300 may be substantially similar to the electronics package 200 described above, with the exception that the cavity is replaced with a through-hole 374 that extends entirely through the package substrate 370. The use of a through-hole 374 allows for Z-height reduction, the ability to stack thicker dies, and/or the ability to stack more dies. However, it is to be appreciated that the use of a through-hole 374 may result in SLIs 372 being depopulated from the area of the package substrate where the through-hole 374 is formed.

In FIGS. 1A-3, the electronics packages each include conductive pillars to provide electrical connections between the package substrate and the first die. However, it is to be appreciated that other package architectures may also be used to form face-to-face stacked dies in accordance with embodiments described herein. Particularly, it is to be appreciated that any suitable structure may be used to overcome the distance between the first die and the package substrate. For example, conductive pillars may be replaced with copper core bumps, or the like.

Figure 4A:
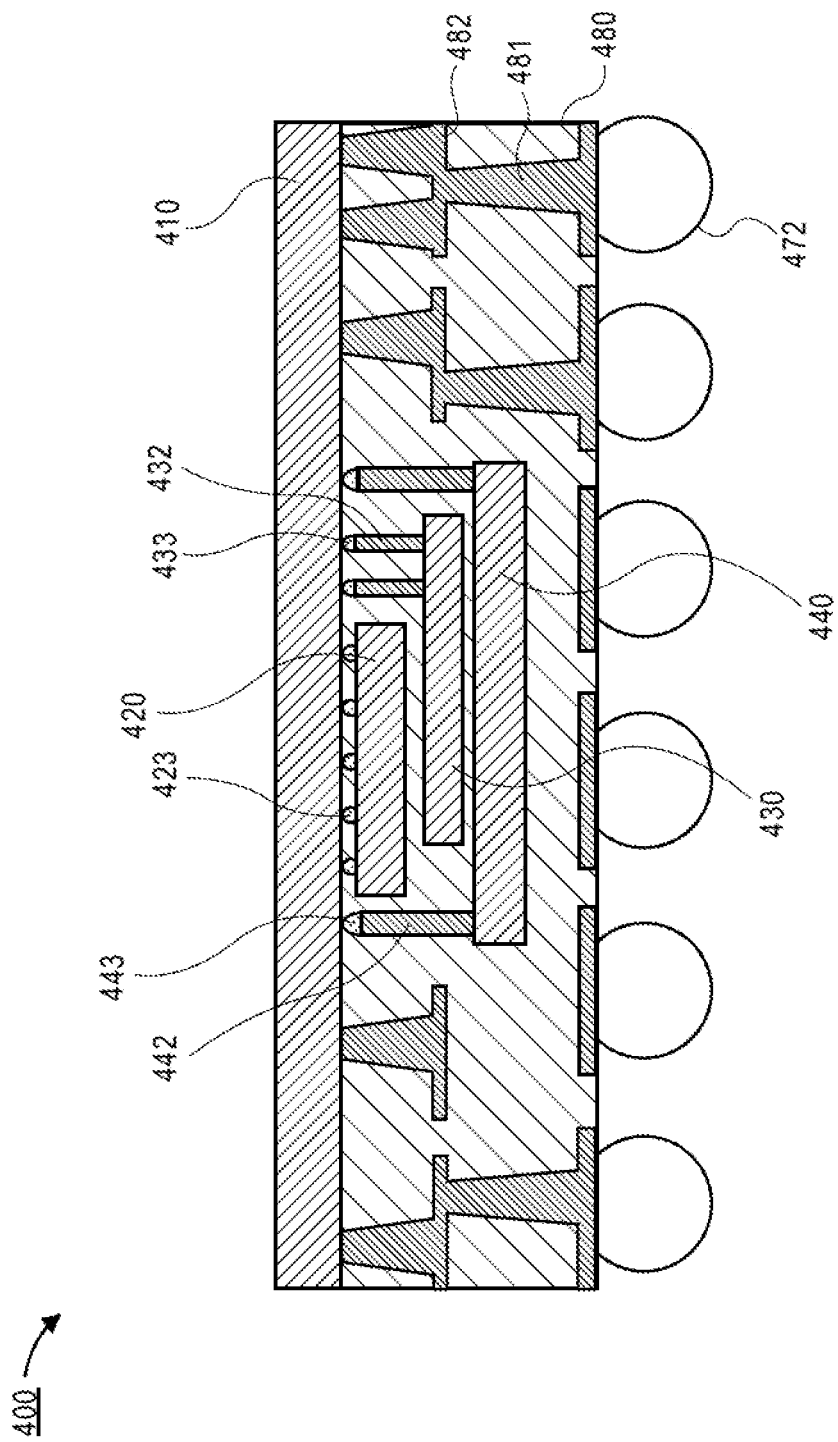
FIG. 4A is a cross-sectional illustration of an electronics package with a first die and a plurality of stacked dies where the electronics package is a wafer level chip scale package (WLCSP), in accordance with an embodiment.

Referring now to FIG. 4A, a cross-sectional illustration of an electronics package 400 is shown, in accordance with an embodiment. In an embodiment, electronics package 400 may have a plurality of dies that are configured in a face-to-face orientation substantially similar to the configuration described above with respect to FIG. 1A, with the exception that the first die 410 is electrically coupled to the SLIs 472 by an RDL 480. In such an embodiment, the package substrate may be omitted. For example, a plurality of conductive traces 482 and vias 481 formed in the RDL 480 may provide electrical connections from the first die 410 to the SLIs 472. An electronics package 400 such as the one illustrated in FIG. 4A may be referred to a WLCSP.

Figure 4B:
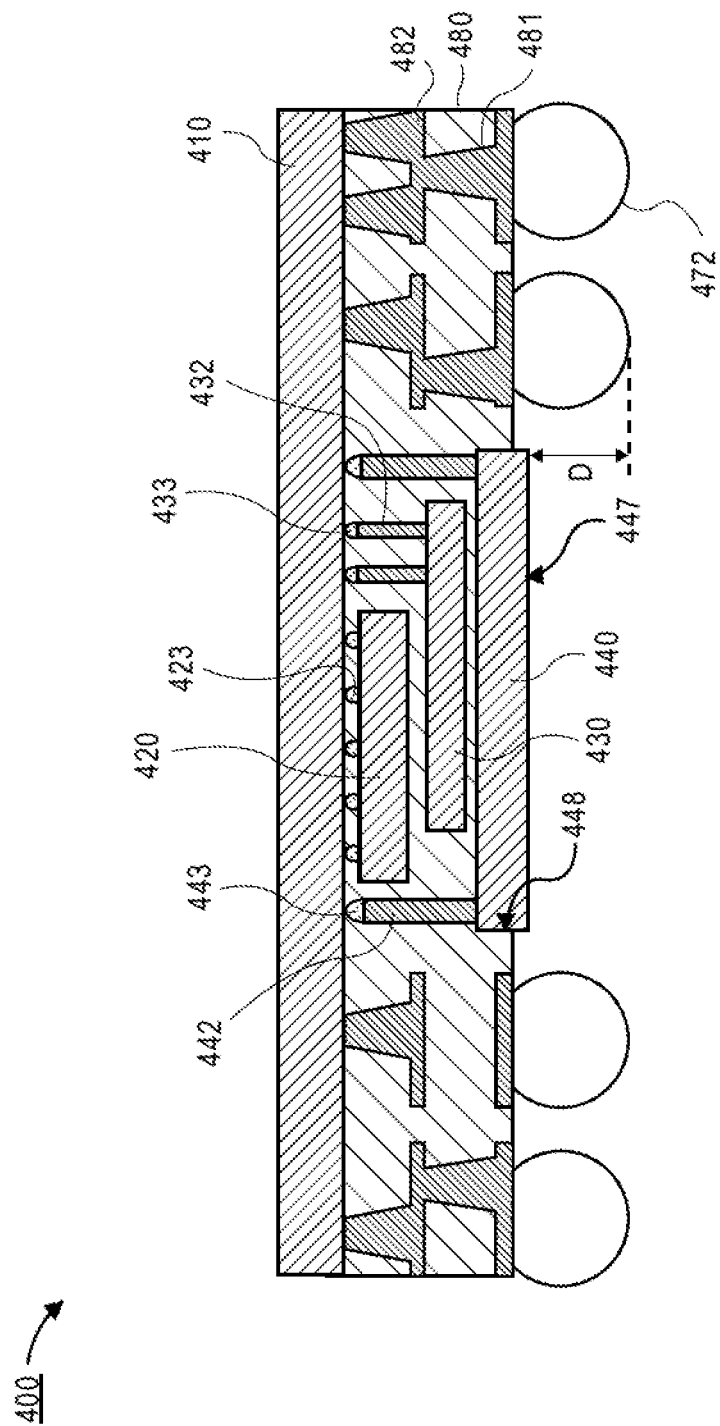
FIG. 4B is a cross-sectional illustration of an electronics package with a first die and a plurality of stacked dies in a WLCSP, where one of the stacked dies extends out of the mold layer, in accordance with an embodiment.

Referring now to FIG. 4B, a cross-sectional illustration of an electronics package 400 is shown, in accordance with an additional embodiment. The electronics package 400 illustrated in FIG. 4B may be substantially the same as the electronics package 400 illustrated in FIG. 4A, with the exception that one of more of the stacked dies extends past the RDL 480. For example, the fourth die 440 extends out past the RDL 480. Particularly, sidewalls 448 and a second surface 447 of the fourth die 440 may be exposed. In such an embodiment, the SLIs 472 may be depopulated from the area of the RDL where the fourth die 440 is exposed. In an embodiment, the second surface 447 of the fourth die 440 may have a standoff distance D that is sufficient to allow for mounting to a printed circuit board (PCB) (not shown). In an embodiment, the standoff distance D may be a function of the pitch and ball diameter of the SLIs 472. In an embodiment, the standoff distance D may be approximately 50 μm or greater.

Figure 5A:
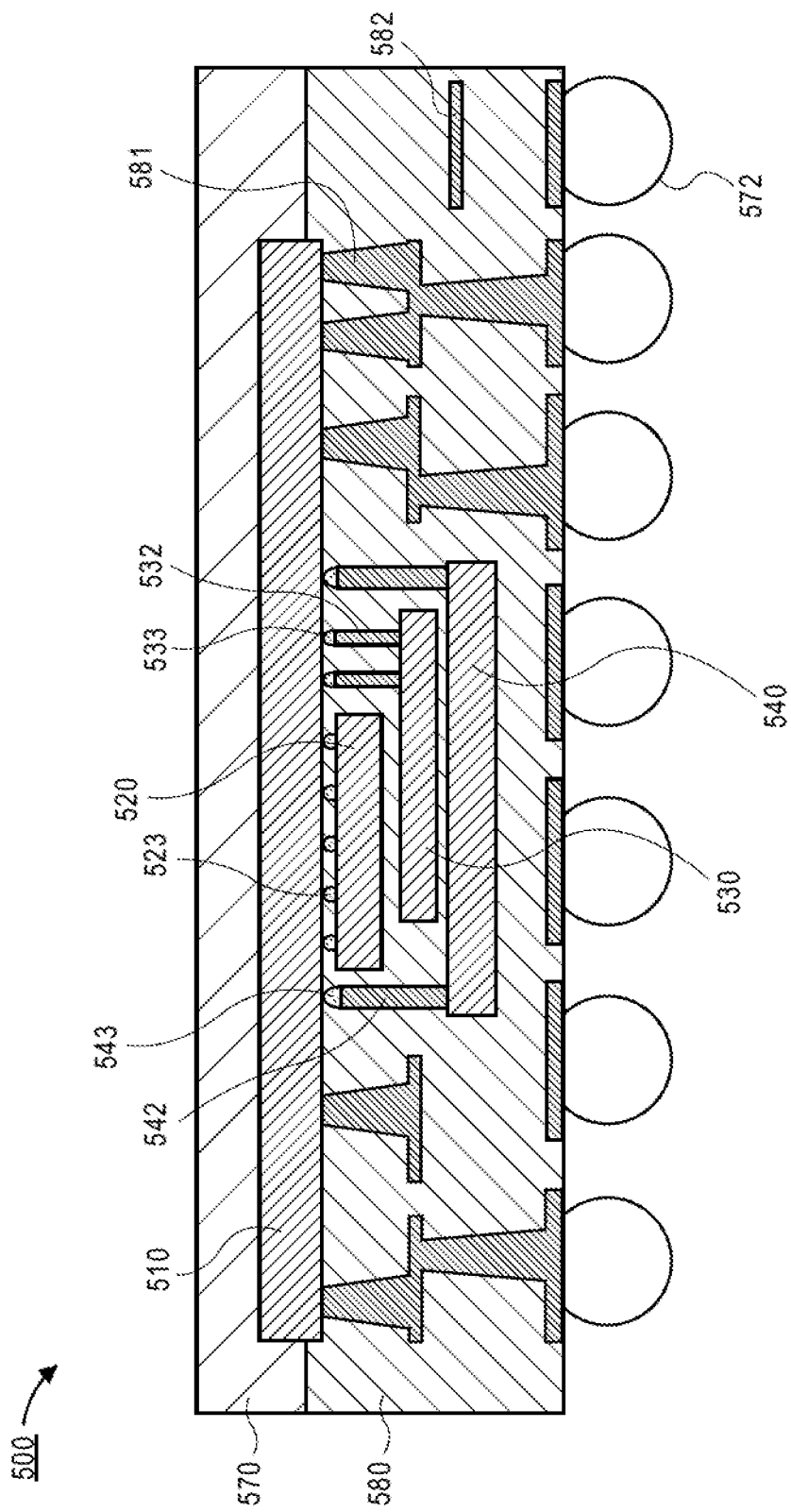
FIG. 5A is a cross-sectional illustration of an electronics package with a first die and a plurality of stacked dies in a fan-out package, in accordance with an embodiment.

Referring now to FIG. 5A, a cross-sectional illustration of an electronics package 500 is shown, in accordance with an additional embodiment. In an embodiment, the electronics package 500 may be referred to as a fan-out package. For example, the electronics package 500 may comprise SLIs 572 that are outside of a footprint of the first die 510. In an embodiment, the SLIs 572 may be electrically coupled to the first die 510 with traces 582 and vias 581 formed in an RDL 580 in a manner substantially similar to the electronics package 400 described above with respect to FIG. 4A. In an embodiment, a mold layer 570 may be formed over the first die 510 and in contact with the RDL 580.

Figure 5B:
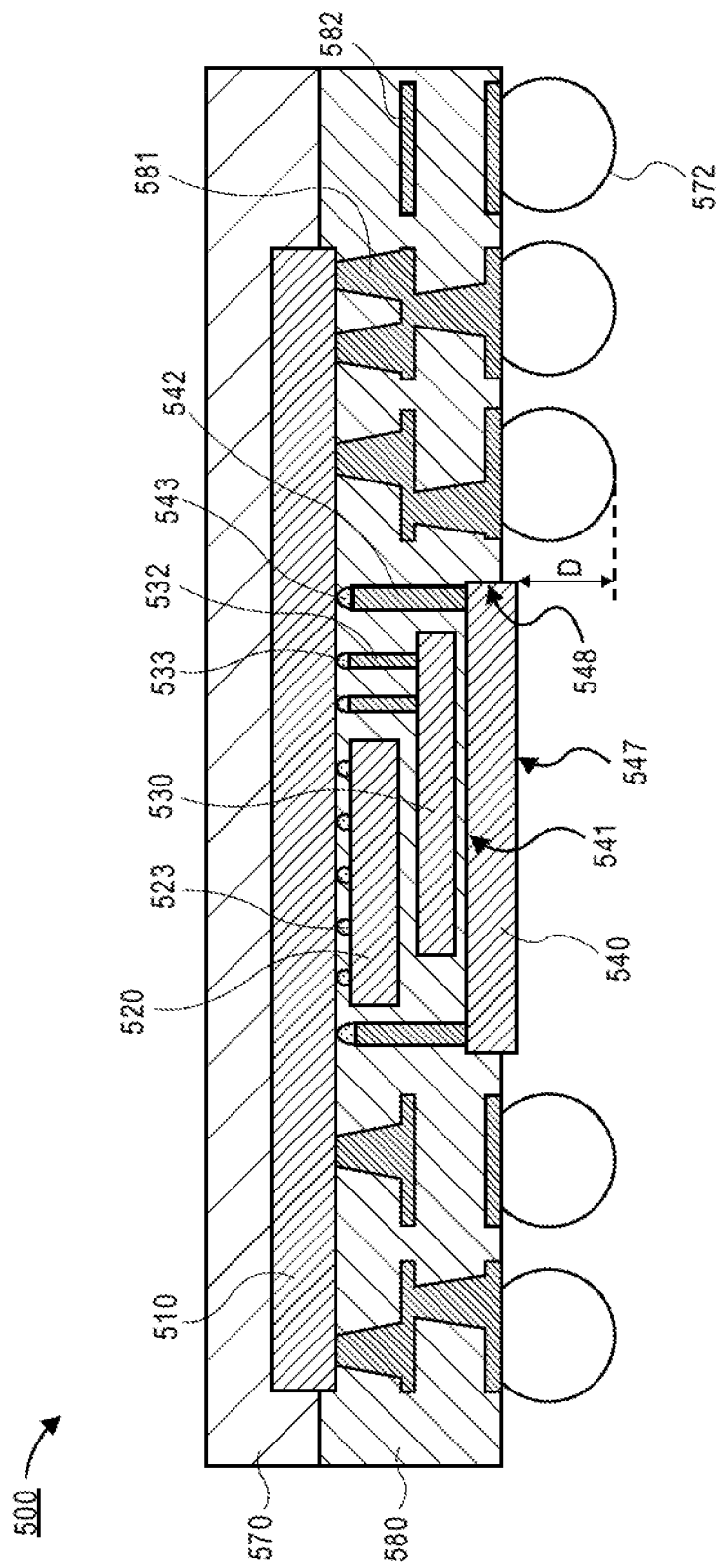
FIG. 5B is a cross-sectional illustration of an electronics package with a first die and a plurality of stacked dies in a fan-out package, where one of the stacked dies extends out of the mold layer, in accordance with an embodiment.

Referring now to FIG. 5B, a cross-sectional illustration of an electronics package 500 is shown, in accordance with an additional embodiment. The electronics package 500 illustrated in FIG. 5B may be substantially the same as the electronics package 500 illustrated in FIG. 5A, with the exception that one of more of the stacked dies extends past the RDL 580. For example, the fourth die 540 extends out past the RDL 580. Particularly, sidewalls 548 and a second surface 547 of the fourth die 540 may be exposed. In such an embodiment, the SLIs 572 may be depopulated from the area of the RDL where the fourth die 540 is exposed. In an embodiment, the second surface 547 of the fourth die 540 may have a standoff distance D that is sufficient to allow for mounting to a printed circuit board (PCB) (not shown). In an embodiment, the standoff distance D may be a function of the pitch and ball diameter of the SLIs 572. In an embodiment, the standoff distance D may be approximately 50 μm or greater.

While the electronics packages described above with respect to FIGS. 1A-5B do not include dies with TSVs, it is to be appreciated that embodiments are not limited to such configurations. For example, embodiments may include one or more stacked dies that comprise TSVs. Examples of such embodiments are described with respect to FIGS. 6A-6C.

Figure 6A:
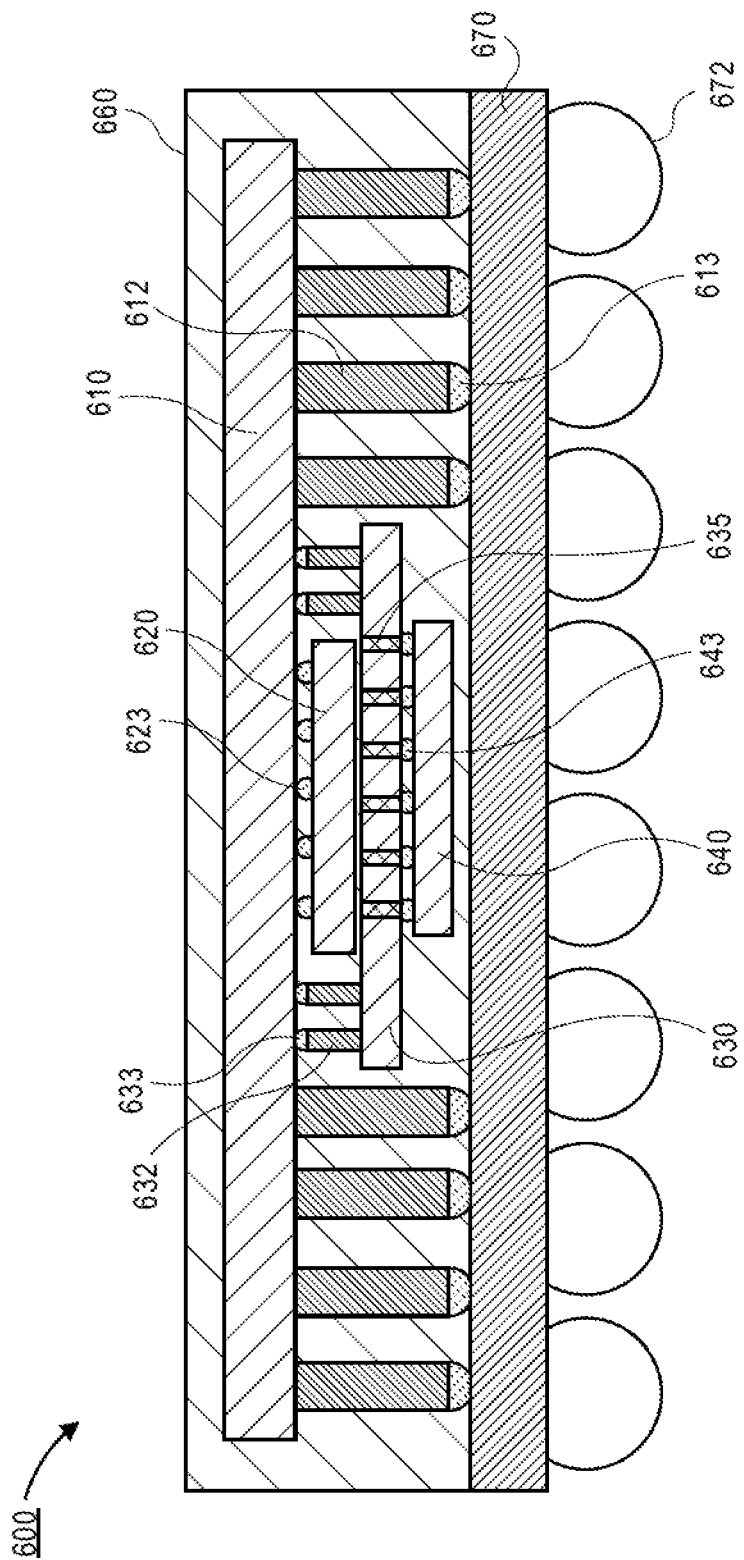
FIG. 6A is a cross-sectional illustration of an electronics package with a first die and a plurality of stacked dies, where one of the stacked dies includes TSVs, in accordance with an embodiment.

Referring now to FIG. 6A, a cross-sectional illustration of an electronics package 600 is shown, in accordance with an embodiment. The electronics package 600 may be substantially similar to the electronics package described with respect to FIG. 1A, with the exception that one of the stacked dies comprises TSVs 635. For example, the third die 630 may include a plurality of TSVs 635. As such, the fourth die 640 that is below the third die 630 does not need to have a keep-out zone since electrical connections to the first die may be made through the third die 630.

Figure 5C:
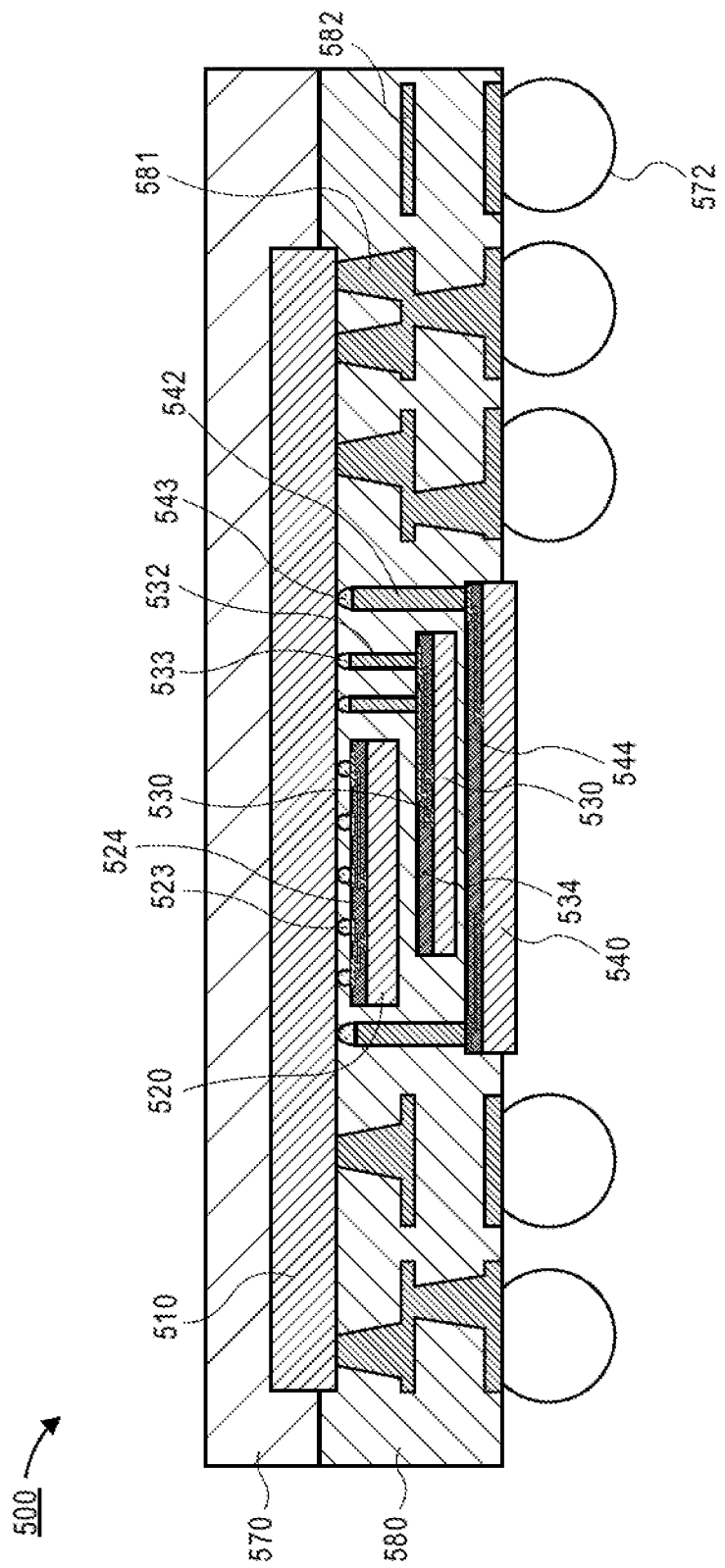
FIG. 5C is a cross-sectional illustration of an electronics package with a first die and a plurality of stacked dies, where the stacked dies comprise redistribution layers, in accordance with an embodiment.

Referring now to FIG. 5C, a cross-sectional illustration of an electronics package 500 is shown, in accordance with an additional embodiment. The electronics package 500 in FIG. 5C may be substantially similar to the electronics package 500 in FIG. 5B, with the exception that the second die 520, the third die 530, and the fourth die 540 may comprise a redistribution layers 524/534/544. In an embodiment, the redistribution layers 524/534/544 may comprise traces, vias, and/or pads. For example, the use of RDLs 524/534/544 allow for the die pads to be formed at any location on the die 520/530/540 instead of being formed only along the outer perimeter of the die below the conductive interconnects 523/532/542. While redistribution layers 524/534/544 are shown in FIG. 5C, it is to be appreciated that any other embodiment described herein may also include redistribution layers over one or more of the dies in order to provide improved flexibility in die pad placement.

Figure 6B:
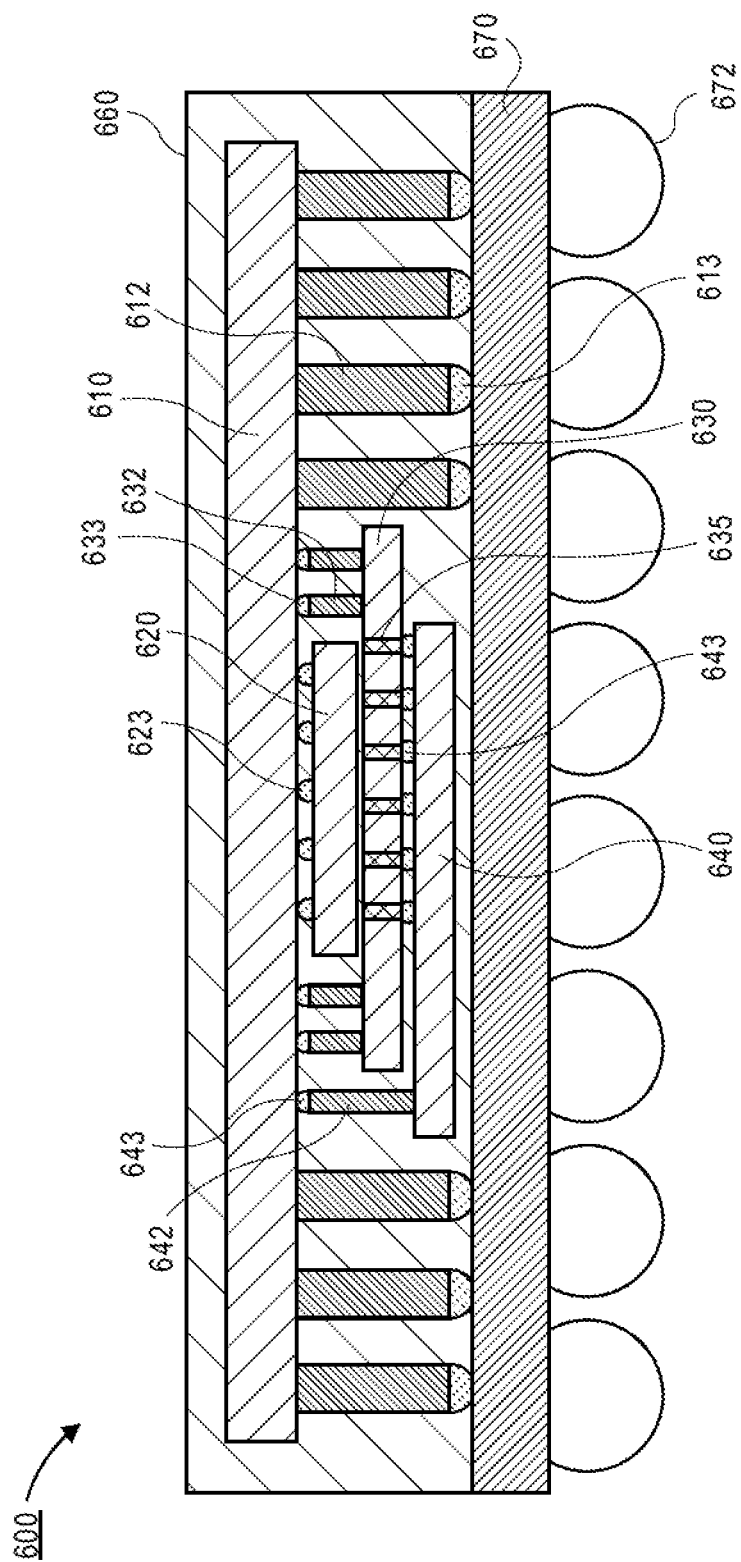
FIG. 6B is a cross-sectional illustration of an electronics package with a first die and a plurality of stacked dies, where one of the stacked dies includes TSVs, in accordance with an additional embodiment.

Referring now to FIG. 6B, a cross-sectional illustration of an electronics package 600 is shown, in accordance with an additional embodiment. In an embodiment, the electronics package 600 may be substantially similar to the electronics package 600 described with respect to FIG. 6A, with the exception that the fourth die 640 may also comprise an electrical connection directly to first die 610. For example, a conductive pillar 642 and solder bump 643 may electrically couple the fourth die 640 to the first die 610 without needing to pass through a TSV 635. However, it is to be appreciated that additional electrical connections may be made to the fourth die 640 by utilizing TSVs 635 through the third die 630.

Figure 6C:
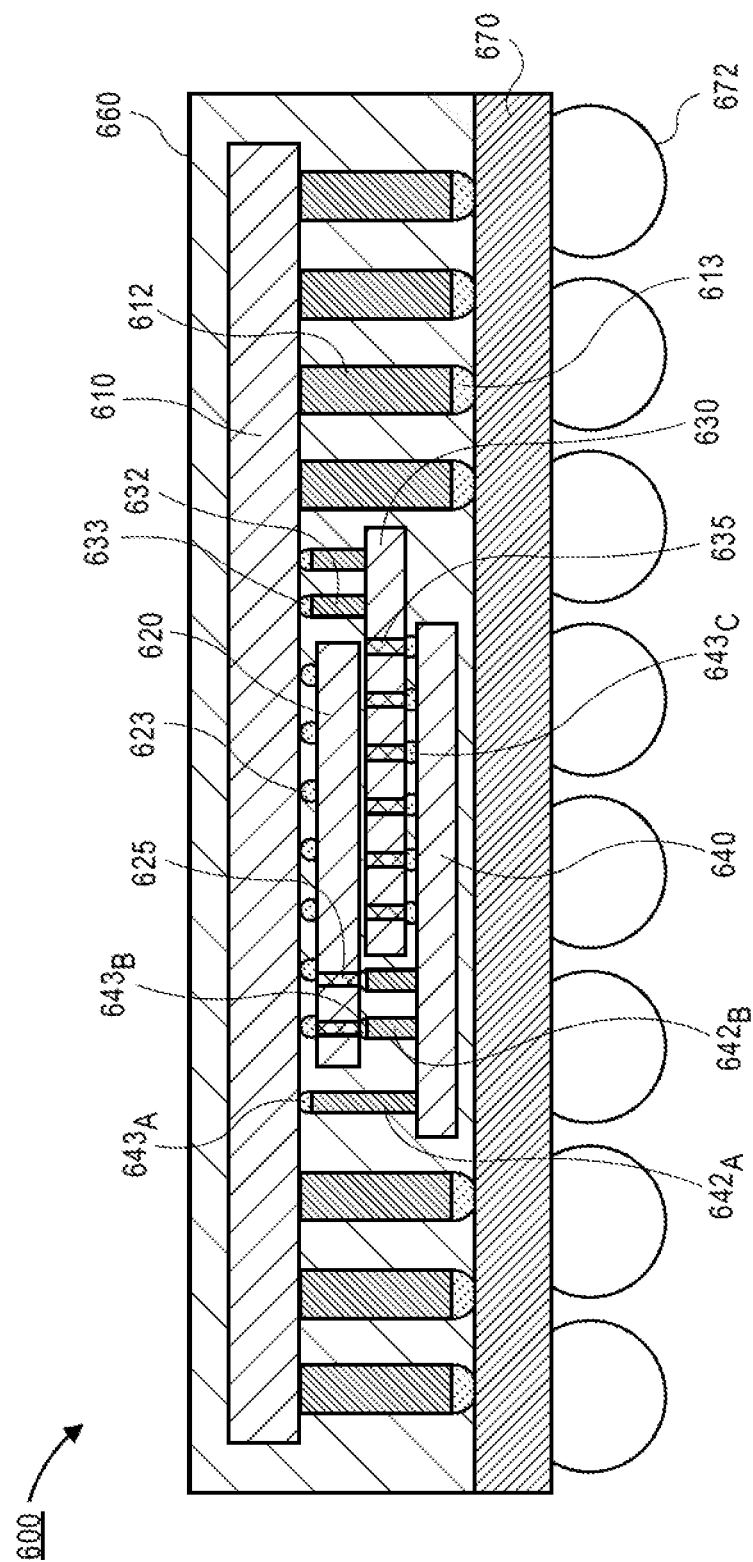
FIG. 6C is a cross-sectional illustration of an electronics package with a first die and a plurality of stacked dies, where more than one of the stacked dies includes TSVs, in accordance with an additional embodiment.

Referring now to FIG. 6C, a cross-sectional illustration of an electronics package 600 is shown, in accordance with an additional embodiment. In an embodiment, the electronics package 600 may be substantially similar to the electronics package 600 described with respect to FIG. 6A, with the exception that a plurality of dies include TSVs. For example, TSVs 625 may be formed through the second die 620, and TSVs 635 may be formed through the third die 630. In such embodiments, electrical connections between the fourth die 640 and the first die 610 may be made by conductive pillar 642A and solder bump 643A without passing through a TSV 625 and through conductive pillar 642B and solder bump 643B that connect to TSV 625. Additional connections to the fourth die 640 may be formed by solder bumps 643c that connect to the TSVs 635 through the third die 630.

Figure 7A:
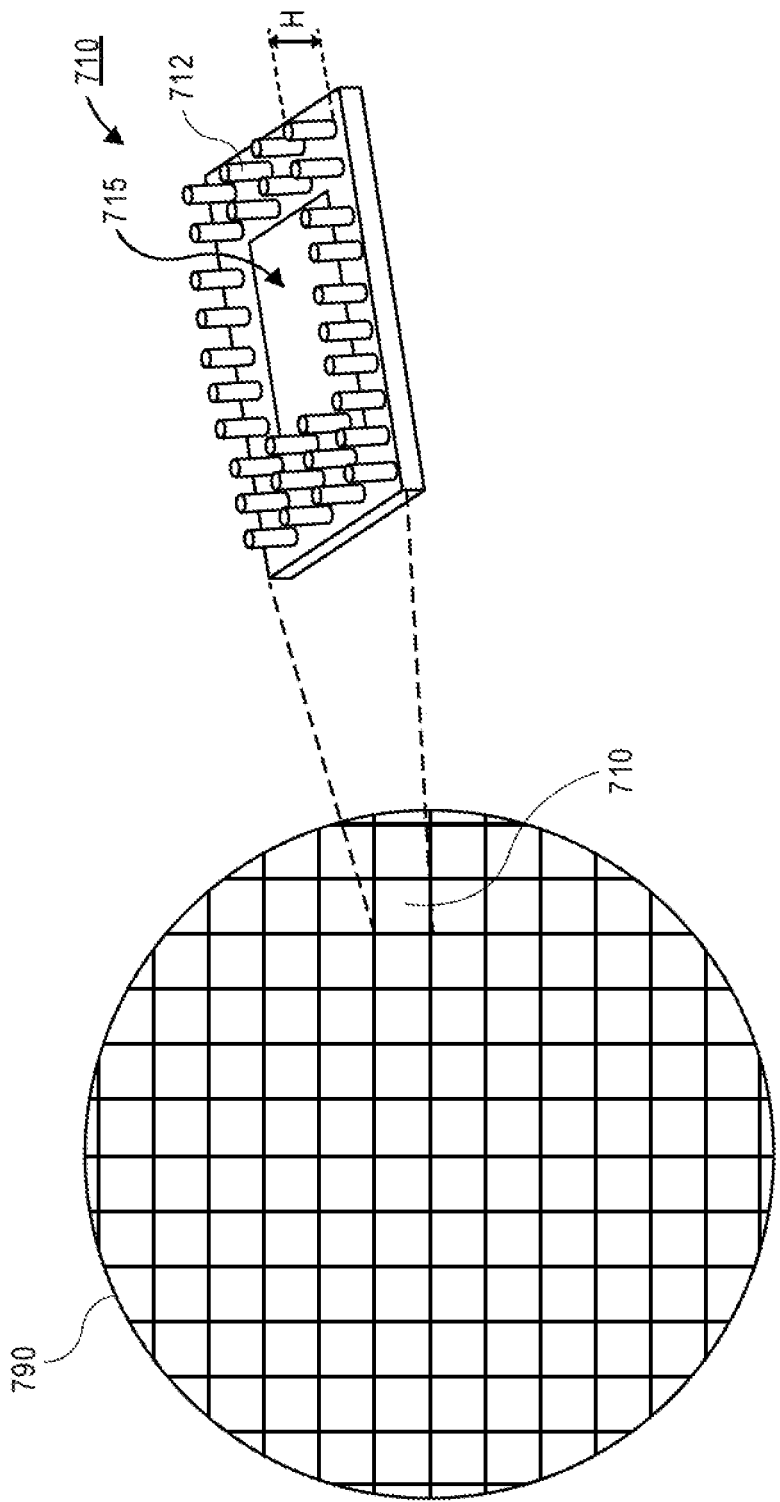
FIG. 7A is a plan view illustration of a wafer and a zoomed in perspective view of a first die on the wafer, in accordance with an embodiment.
Figure 7B:
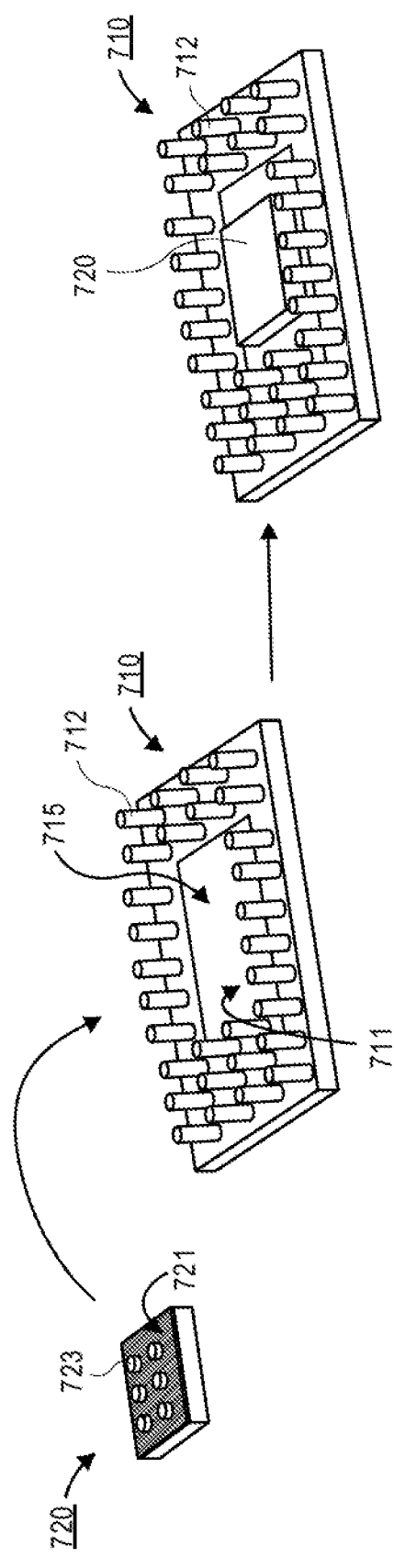
FIG. 7B is a perspective view of a process for mounting a second die onto the first die, in accordance with an embodiment.
Figure 7C:
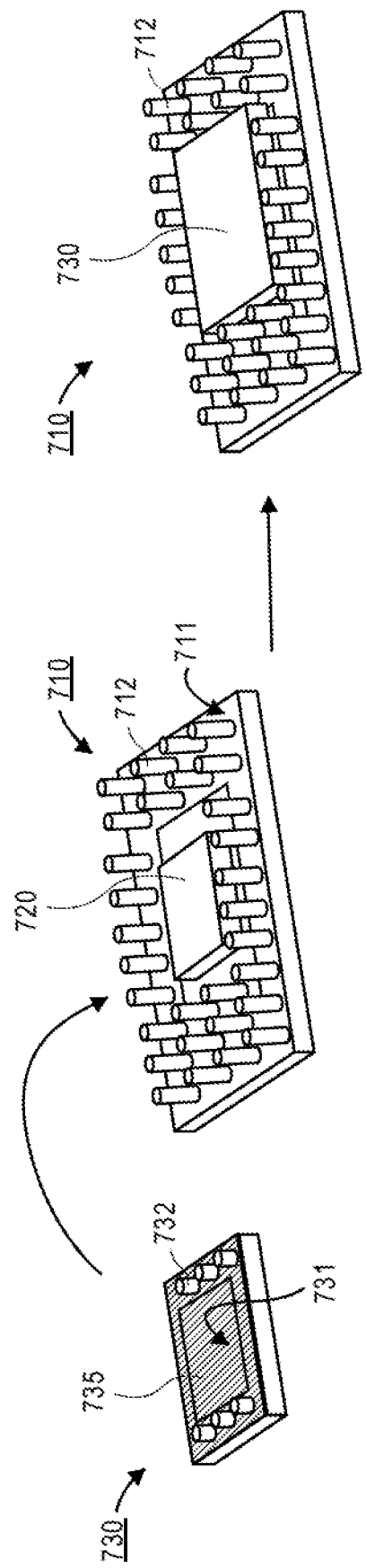
FIG. 7C is a perspective view of a process for mounting a third die onto the first die, in accordance with an embodiment.

Referring now to FIGS. 7A-7C, a series of illustrations depict a process that may be used to form electronics packages such as those described above is shown, in accordance with an embodiment.

Referring now to FIG. 7A, a plan view illustration of a wafer 790 with a plurality of dies 710 is shown, in accordance with an embodiment. FIG. 7A also illustrates a zoomed in perspective illustration of a first die 710 formed on the wafer 790, in accordance with an embodiment.

In an embodiment, the wafer 790 may be any suitable semiconductor wafer (e.g., a silicon wafer, a silicon on insulator (SIO), a III-V semiconductor material, or the like). In an embodiment the wafer 790 may comprise a plurality of first dies 710, as is known in the art. For example, the wafer 790 may comprise hundreds, thousands, tens of thousands, or more first dies 710.

In an embodiment, the first dies 710 may comprise a plurality of conductive pillars 712. The conductive pillars 712 may have a height H that is suitable for forming electronics packages such as those described above that include a plurality of dies stacked in a face-to-face configuration. For example, the height H may be 20 µm or greater, 50 µm or greater, or 100 µm or greater. In an embodiment the conductive pillars 712 may be high aspect ratio pillars. For example, the height:width aspect ratio of the conductive pillars may be 2:1 or greater, 3:1 or greater, 5:1 or greater, or 10:1 or greater. In an embodiment, other interconnects may be substituted for the conductive pillars 712. For example, conductive pillars may be replaced with copper core bumps, or the like.

In an embodiment, the first dies 710 may comprise a keep-out zone 715. In an embodiment, the conductive pillars 712 may be formed only outside of the keep-out zone 715. As such, subsequently placed dies may be positioned in the keep-out zone of the first dies 710.

Referring now to FIG. 7B, a perspective illustration of a process for mounting a second die 720 to the first die 710 is shown, in accordance with an embodiment. In an embodiment, the solder bumps 723 may be formed on the first surface 721 of the second die 720. As illustrated by the arrow, the second die 720 may be mounted to the first die 710. Particularly, the first surface 721 of the second die 720 may be oriented so that it faces the first surface 711 of the first die 710. In an embodiment, the second die 720 may be mounted entirely within the keep-out zone 715 of the first die 710.

Referring now to FIG. 7C, a perspective illustration of a process for mounting a third die 730 to the first die 710 is shown, in accordance with an embodiment. In an embodiment the third die 730 may comprise a plurality of conductive pillars 732 and a keep-out zone 735. The conductive pillars 732 may be formed outside of the keep-out zone 735. The keep-out zone 735 of the third die 730 may be sized so that it covers the second die 720 when the third die 730 is mounted to the first die 710, as indicated by the arrow. In an embodiment, a first surface 731 of the third die 730 may be mounted so that the first surface 731 faces the first surface 711 of the first die 710.

Figure 7D:
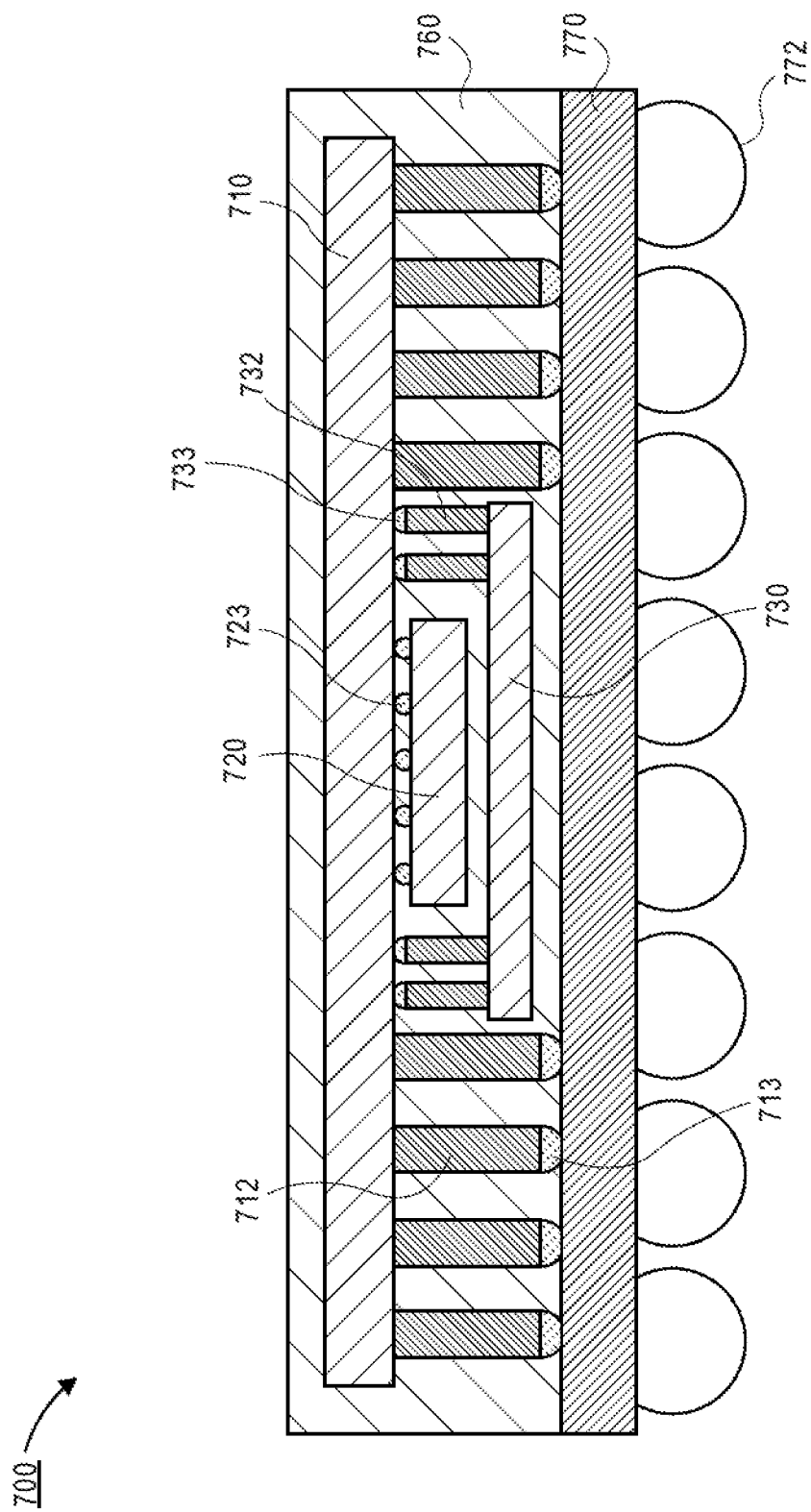
FIG. 7D is a cross-sectional illustration of the electronics package in FIG. 7C, in accordance with an embodiment.

Referring now to FIG. 7D, a cross-sectional illustration of the electronics package 700 after the first die 710 is mounted to a package substrate 770 is shown, in accordance with an embodiment. As shown, the second die 720 is proximate to the first die 710. The third die 730 may be spaced away from the first die 710 by the second die 720. In an embodiment, the conductive pillars of the third die 730 are formed outside the perimeter of the second die 720. However, other configurations, such as configurations described with greater detail above may be formed with similar processes.

While particular examples of face-to-face stacked die configurations are provided with respect to FIGS. 1A-7D, it is to be appreciated that other configurations may be used. For example, fewer numbers of dies, greater numbers of dies, more than one die at a given Z-height, different combinations of TSVs, the use of conductive pillars, and/or the use of RDLs may be used to provide the desired functionality and/or form factor for a given electronics package.

Figure 8:
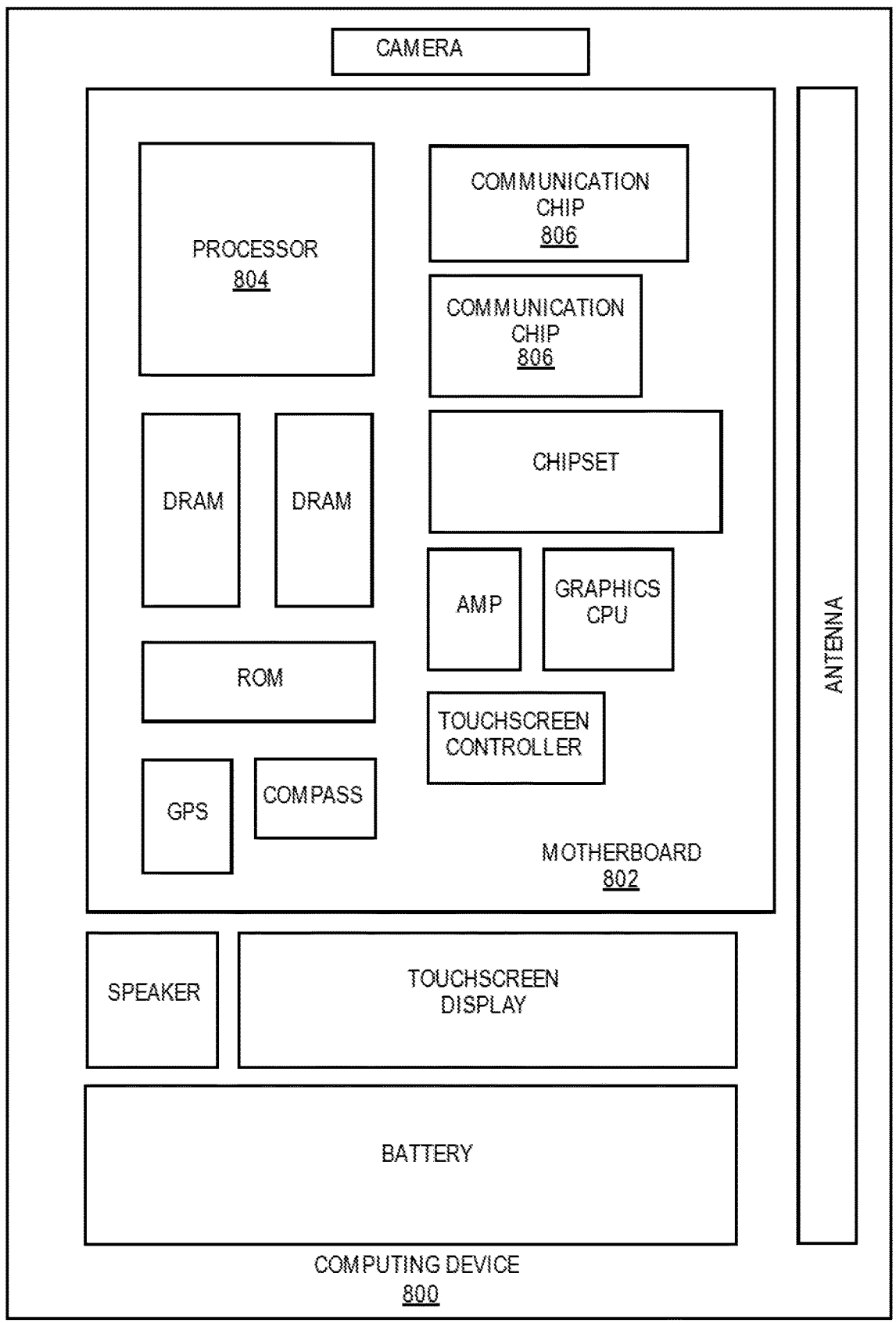
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be communicatively coupled to one or more stacked dies in a face-to-face configuration, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be communicatively coupled to one or more stacked dies in a face-to-face configuration, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronics package, comprising: a first die, wherein the first die comprises a plurality of first conductive interconnects extending out from a first surface of the first die, and wherein the first die comprises a keep out zone; and a second die, wherein the second die is positioned entirely within a perimeter of the keep out zone of the first die, and wherein a first surface of the second die faces the first surface of the first die.

Example 2: the electronics package of Example 1, wherein the conductive interconnects have a height that is greater than a thickness of the second die.

Example 3: the electronics package of Example 1 or Example 2, wherein the conductive interconnects have an aspect ratio that is 3:1 or greater.

Example 4: the electronics package of Examples 1-3, wherein the second die is electrically coupled to the first die by solder bumps.

Example 5: the electronics package of Examples 1-4, wherein the first surface of the first die comprises active devices, and wherein the first surface of the second die comprises active devices.

Example 6: the electronics package of Examples 1-5, further comprising a third die, wherein the third die is entirely within a perimeter of the keep out zone of the first die, and wherein the third die comprises a plurality of pillars extending out from a first surface of the third die, wherein the plurality of pillars extending out from a first surface of the third die electrically coupled the third die to the first die.

Example 7: the electronics package of Examples 1-6, wherein the second die is positioned between the first surface of the first die and the first surface of the third die.

Example 8: the electronics package of Examples 1-7, wherein the third die comprises a keep out zone, and wherein the second die is positioned over the keep out zone of the third die.

Example 9: the electronics package of Examples 1-8, wherein the second die is positioned entirely within a perimeter of the keep out zone of the third die.

Example 10: the electronics package of Examples 1-9, wherein a portion of the second die is positioned over the keep out zone of the third die.

Example 11: the electronics package of Examples 1-10, further comprising: a package substrate electrically coupled to the first die by the plurality of conductive interconnects.

Example 12: the electronics package of Examples 1-11, wherein the package substrate comprises a recess within the perimeter of the keep out zone of the first die.

Example 13: the electronics package of Examples 1-12, wherein the package substrate comprises an opening completely through the package substrate within the perimeter of the keep out zone of the first die.

Example 14: the electronics package of Examples 1-13, further comprising a third die and a fourth die, wherein the third die and the fourth die are entirely within a perimeter of the keep out zone of the first die.

Example 15: the electronics package of Examples 1-14, wherein at least one of the second die, the third die, and the fourth die comprise through substrate vias.

Example 16: an electronics package, comprising: a first die, wherein the first die comprises a keep out zone; a second die, wherein a first surface of the first die faces a first surface of the second die, and wherein the second die is positioned within a perimeter of the keep out zone of the first die; and a third die, wherein the third die comprises a plurality of conductive pillars extending out from a first surface of the third die, and wherein the conductive pillars electrically couple the third die to the first die.

Example 17: the electronics package of Example 16, wherein the electronics package is a wafer level chip scale (WLCS) package.

Example 18: the electronics package of Example 16 or Example 17, wherein the electronics package is a fan out package.

Example 19: the electronics package of Examples 16-18, wherein the third die comprises a keep out zone, and wherein the second die is positioned at least partially within the keep out zone of the third die.

Example 20: the electronics package of Examples 16-19, further comprising a mold layer over the first die, wherein the second die and the third die are embedded within the mold layer.

Example 21: the electronics package of Examples 16-20, wherein the third die is entirely embedded within the mold layer.

Example 22: the electronics package of Examples 16-21, wherein the third die extends at least partially out of the mold layer, and wherein a bottom surface of the third die has a standoff distance from an underlying printed circuit board (PCB) that is approximately 50 μm or greater.

Example 23: a computer system, comprising: a first die; a second die communicatively coupled to the first die, wherein a first surface of the first die faces a first surface of the second die; a third die, wherein a first surface of the third die faces a first surface of the first die, and wherein the third die is electrically coupled to the first die by a plurality of conductive pillars; and a plurality of second level interconnects electrically coupled to the first surface of the first die, wherein the second die and the third die are positioned between the first surface of the first die and the second level interconnects.

Example 24: the computer system of Example 23, wherein the plurality of second level interconnects are coupled to the first die by copper pillars that extend out from the first surface of the first die.

Example 25: the computer system of Example 23 or Example 24, wherein the plurality of second level interconnects are coupled to the first die by vias and traces in a redistribution layer.

The invention claimed is:

1. An electronics package, comprising:
a first die, wherein the first die comprises a plurality of first conductive interconnects extending out from a first surface of the first die, and wherein the first die comprises a keep out zone;
a second die, wherein the second die is positioned entirely within a perimeter of the keep out zone of the first die, wherein a first surface of the second die faces the first surface of the first die, and wherein the first surface of the second die is coupled to the first surface of the first die by a plurality of second conductive interconnects, the plurality of second conductive interconnects vertically between the second die and the first die;
a third die, wherein the third die is electrically coupled to the first die by a pluralities of interconnects extending out from a first surface of the third die, wherein the conductive interconnects are laterally spaced apart from the second die;
a package substrate electrically coupled to the first die by the plurality of first conductive interconnects, wherein the package substrate comprises a recess within the perimeter of the keep out zone of the first die.

2. The electronics package of claim 1, wherein the conductive interconnects have a height that is greater than a thickness of the second die.

3. The electronics package of claim 1, wherein the conductive interconnects have an aspect ratio that is 3:1 or greater.

4. The electronics package of claim 1, wherein the second die is electrically coupled to the first die by solder bumps.

5. The electronics package of claim 4, wherein the first surface of the first die comprises active devices, and wherein the first surface of the second die comprises active devices.

6. The electronics package of claim 1, further comprising:
a third die, wherein the third die is entirely within a perimeter of the keep out zone of the first die, and wherein the third die comprises a plurality of pillars extending out from a first surface of the third die, wherein the plurality of pillars extending out from a first surface of the third die electrically coupled the third die to the first die.

7. The electronics package of claim 6, wherein the second die is positioned between the first surface of the first die and the first surface of the third die.

8. The electronics package of claim 7, wherein the third die comprises a keep out zone, and wherein the second die is positioned over the keep out zone of the third die.

9. The electronics package of claim 8, wherein the second die is positioned entirely within a perimeter of the keep out zone of the third die.

10. The electronics package of claim 8, wherein a portion of the second die is positioned over the keep out zone of the third die.

11. The electronics package of claim 1, further comprising a fourth die, wherein the third die and the fourth die are entirely within a perimeter of the keep out zone of the first die.

12. The electronics package of claim 11, wherein at least one of the second die, the third die, and the fourth die comprise through substrate vias.

13. An electronics package, comprising:
a first die, wherein the first die comprises a keep out zone;
a second die, wherein a first surface of the first die faces a first surface of the second die, wherein the second die is positioned within a perimeter of the keep out zone of the first die, and wherein the first surface of the second die is coupled to the first surface of the first die by a plurality of conductive interconnects, the plurality of conductive interconnects vertically between the second die and the first die; and
a third die, wherein the third die comprises a plurality of conductive pillars extending out from a first surface of the third die, and wherein the conductive pillars electrically couple the third die to the first die, wherein the conductive pillars are laterally spaced apart from the second die.

14. The electronics package of claim 13, wherein the electronics package is a wafer level chip scale (WLCS) package.

15. The electronics package of claim 13, wherein the electronics package is a fan out package.

16. The electronics package of claim 13, wherein the third die comprises a keep out zone, and wherein the second die is positioned at least partially within the keep out zone of the third die.

17. The electronics package of claim 13, further comprising a mold layer over the first die, wherein the second die and the third die are embedded within the mold layer.

18. The electronics package of claim 17, wherein the third die is entirely embedded within the mold layer.

19. The electronics package of claim 17, wherein the third die extends at least partially out of the mold layer, and wherein a bottom surface of the third die has a standoff distance from an underlying printed circuit board (PCB) that is approximately 50 µm or greater.

20. A computer system, comprising:
   a first die;
   a second die communicatively coupled to the first die, wherein a first surface of the first die faces a first surface of the second die, and wherein the first surface of the second die is coupled to the first surface of the first die by a plurality of conductive interconnects, the plurality of conductive interconnects vertically between the second die and the first die;
   a third die, wherein a first surface of the third die faces a first surface of the first die, and wherein the third die is electrically coupled to the first die by a plurality of conductive pillars;
   a plurality of second level interconnects electrically coupled to the first surface of the first die, wherein the second die and the third die are positioned between the first surface of the first die and the second level interconnects; and
   a package substrate electrically coupled to the first die by the plurality of second level interconnects, wherein the package substrate extends vertically beneath the second die and the third die.

21. The computer system of claim 20, wherein the plurality of second level interconnects are coupled to the first die by copper pillars that extend out from the first surface of the first die.

22. The computer system of claim 20, wherein the plurality of second level interconnects are coupled to the first die by vias and traces in a redistribution layer.

23. An electronics package, comprising:
   a first die, wherein the first die comprises a plurality of first conductive interconnects extending out from a first surface of the first die, and wherein the first die comprises a keep out zone;
   a second die, wherein the second die is positioned entirely within a perimeter of the keep out zone of the first die, and wherein a first surface of the second die faces the first surface of the first die; and
   a third die, wherein the third die is entirely within a perimeter of the keep out zone of the first die, and wherein the third die comprises a plurality of pillars extending out from a first surface of the third die, wherein the plurality of pillars extending out from a first surface of the third die electrically coupled the third die to the first die, wherein the second die is positioned between the first surface of the first die and the first surface of the third die, wherein the third die comprises a keep out zone, and wherein the second die is positioned over the keep out zone of the third die.

* * * * *